United States Patent [19]

Yang

[11] Patent Number: 5,569,613

[45] Date of Patent: Oct. 29, 1996

[54] METHOD OF MAKING BIPOLAR JUNCTION TRANSISTOR

[75] Inventor: Sheng-Hsing Yang, Hsinchu, Taiwan

[73] Assignee: United Microelectronics Corp., Hsinchu, Taiwan

[21] Appl. No.: 382,387

[22] Filed: Feb. 1, 1995

[51] Int. Cl.⁶ ............................................. H01L 21/8222
[52] U.S. Cl. .................. 437/33; 437/162; 437/149; 437/150; 257/526; 257/586; 257/592
[58] Field of Search .................. 437/33, 149, 150, 437/162; 257/526, 586, 592

[56] References Cited

U.S. PATENT DOCUMENTS

| | | | |
|---|---|---|---|
| 4,883,772 | 11/1989 | Cleeves et al. | 437/200 |
| 5,034,338 | 7/1991 | Neppl et al. | 437/33 |
| 5,039,624 | 8/1991 | Kadota | 437/31 |
| 5,455,188 | 10/1995 | Yang | 437/32 |
| 5,478,760 | 12/1995 | Yang | 437/31 |

*Primary Examiner*—Mary Wilczewski
*Assistant Examiner*—Richard A. Booth
*Attorney, Agent, or Firm*—Ladas & Parry

[57] ABSTRACT

A structural configuration and fabrication process of a bipolar junction transistor (BJT) semiconductor device having improved current gain. The fabrication process provides a P-type heavily-doped region underneath a P-type lightly-doped base region. The P-type heavily-doped region underneath the P-type lightly-doped base region prevents electron carriers from escaping from beneath the base region of the transistor, helping the collection in a collector of electron carriers emitted by an emitter of the BJT.

5 Claims, 7 Drawing Sheets

METHOD OF MAKING BIPOLAR JUNCTION TRANSISTOR

BACKGROUND OF THE INVENTION

1. Field of the Invention

The present invention relates in general to the semiconductor structural configuration of a bipolar junction transistor (BJT) and the process for its fabrication. In particular, the present invention relates to a BJT, and its process for fabrication, such that the BJT has improved current gain characteristics.

2. Technical Background

Conventional BJT's have limited current gain characteristics due to inherent limitations in their semiconductor structural configurations. FIG. 1 of the accompanying drawing shows schematically the cross section of a conventional BJT.

As is seen in FIG. 1, a conventional BJT is fabricated out of N-type substrate 1. P-well regions 10, although only one is shown in the drawing, are formed in N-type substrate 1 by methods known in the art. $N^+$-type emitter regions 12, as well as N+-type collectors 14, are formed in P-well 10 subsequently for the bipolar junction transistor. P-well contact regions 16, that is, the contact regions for the base regions are then fabricated thereon. Insulation layer 18 is formed on substrate 1 and metal contacts 20 are then formed.

Since, as is observed in the drawing, emitter region 12 is not sufficiently isolated from contact region 16 of base region 10, electrons flow, that is, a significant portion of the flow of negative carriers as emitted by emitter region 12, is absorbed by contact region 16 of base region 10. The desired electron flow from emitter to collector thereby decreases, causing the conventional lateral BJT device to exhibit current gain characteristics smaller than expected.

SUMMARY OF THE INVENTION

It is therefore an object of the present invention to provide a process for fabricating a BJT having improved current gain characteristics.

The above indicated object is achieved by providing a novel fabrication process for a bipolar junction transistor semiconductor device. The fabrication process results in a BJT structural architecture having a P-type heavily-doped region underneath a P-type lightly-doped base region of the bipolar junction transistor structural configuration. The structure prevents electron carriers from escaping from beneath the base region of the transistor and helps the collection in the collector region of the electron carriers emitted by the emitter of the transistor device. Immediate improvement of the current gain characteristics of the BJT results.

The fabrication process details are as follows. A field oxide is formed on a designated location on a semiconductor substrate of a first conductivity type for defining base and emitter regions of the bipolar junction transistor. The field oxide is used as a masking layer for implanting impurities of a second conductivity type into the substrate in an area surrounded by the field oxide, the impurities being further driven into a depth beneath the field oxide, forming a lightly-doped base region of the second conductivity type for the bipolar junction transistor. The field oxide is used as a masking layer for etching to form a recessed groove in the substrate surrounded by the field oxide. Impurities of the second conductivity type are implanted and driven into the recessed groove, forming a heavily-doped region of the second conductivity type beneath the recessed groove and the lightly-doped base region of the second conductivity type. An insulating layer is formed on the heavily-doped region of the second conductivity type in the recessed groove. An electrically conducting layer is formed in the recessed groove and impurities of the first type are implanted into the conducting layer, the impurities further diffusing into the lightly-doped base region of the second conductivity type via side edges of the recessed groove, thereby forming a heavily-doped emitter region of the first conductivity type for the bipolar junction transistor. The electrically conducting layer and the field oxide are then used as masking layers for implanting impurities of the first type into the substrate, forming a contact for a collector region of the bipolar junction transistor. Other objects, features and advantages of the present invention will become apparent by way of the following detailed description of the preferred but non-limiting embodiment.

BRIEF DESCRIPTION OF THE DRAWING

The detailed description is made with reference to the accompanying drawings, wherein.

DETAILED DESCRIPTION OF THE PREFERRED EMBODIMENT

To describe the structural configuration and its process of fabrication of the BJT semiconductor device of the present invention, reference is made to FIGS. 2a to 2i, which schematically depict the appropriate cross sections of the BJT in accordance with a preferred embodiment of the present invention, as taken from selected stages in the process of fabrication.

Figure 3:
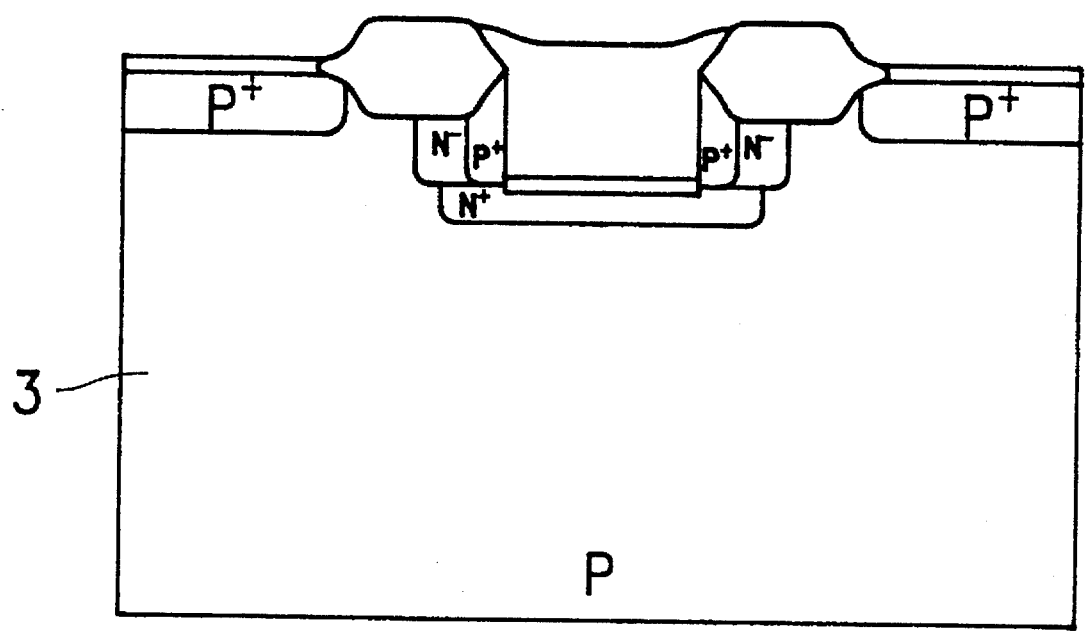
FIG. 3 schematically shows the cross section of a symmetrical BJT fabricated in accordance with another preferred embodiment of the present invention.

The structural configuration, as well as the process of fabrication, of the BJT semiconductor device of the present invention is equally applicable to either an N- or P-type semiconductor substrate, although in the detailed description of the present invention, a device, and its related process of fabrication, based on an N-type substrate is selected. Persons skilled in the art can apparently appreciate the structural configuration and its related process of fabrication for a BJT based on a P-type substrate 3, as shown in FIG. 3.

As indicated above, the structural configuration and the process of fabrication of the BJT of a preferred embodiment of the present invention is described in the following selected process stages.

Notice should be taken that in the accompanied drawings dimensions such as the depth, or width, of the structural layers are not drawn to exact scale. The dimensions in the drawings are drawn to the relative scale for the understanding of the description of the present invention.

Stage 1

Figure 1:
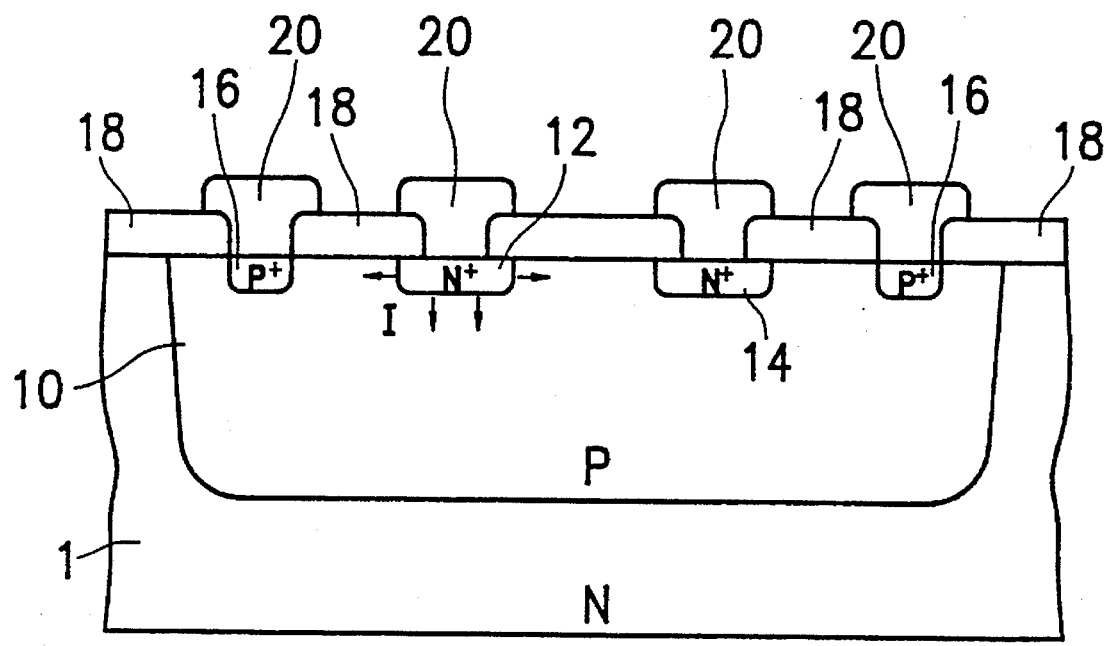
FIG. 1 schematically shows the cross section of a conventional BJT.
Figure 2A:
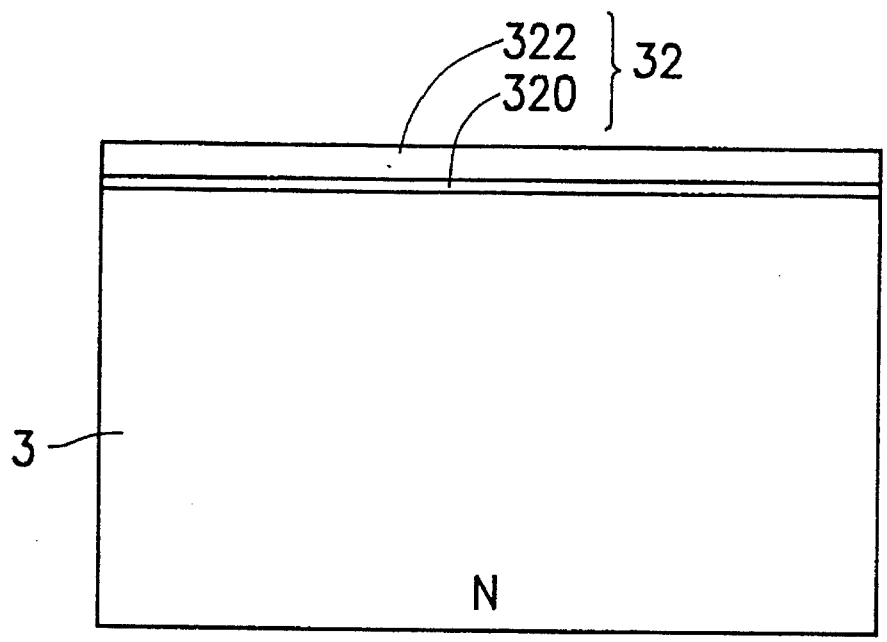
FIGS. 2a to 2i schematically show the cross sections of a symmetrical BJT fabricated in accordance with a preferred embodiment of the present invention, as depicted in selected processing stages during its fabrication.

Referring to FIG. 2a, the surface of semiconductor substrate 3 of the N type conductivity is formed with a layer of masking layer 32 by first applying a process of thermal oxidation to make a layer of pad oxide 320 with a thickness of about 300–600 A and then depositing a layer of nitride 322 with a thickness of about 1,000–2,500 A. Masking layer 32 therefore includes pad oxide layer 320 and nitride layer 322 collectively.

Figure 2B:
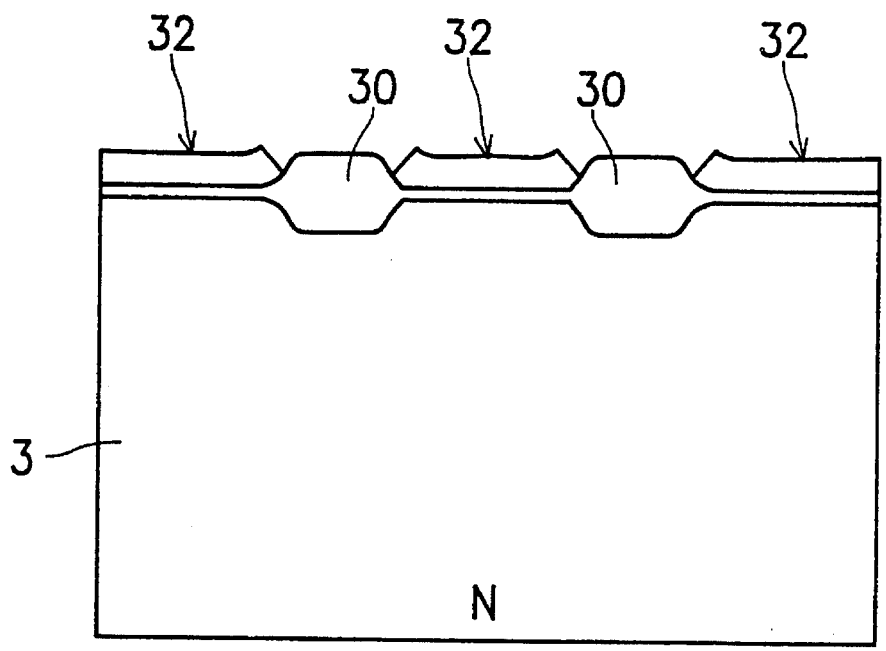

A photolithography procedure is then performed to the surface of masking layer 32, in order to define the area where the field oxide of the BJT device is to reside. A thermal oxidation procedure is then performed to form field oxide 30 as shown in FIG. 2b, having a thickness of about 5,000–10,000 A. Masking layer 32 can then be removed, and a thin layer of oxide 324, as shown in FIG. 2C, can then be formed on substrate 3 by thermal oxidation, having a thickness of about 100–300 A, in order to protect the substrate 3.

Stage 2

Figure 2C:
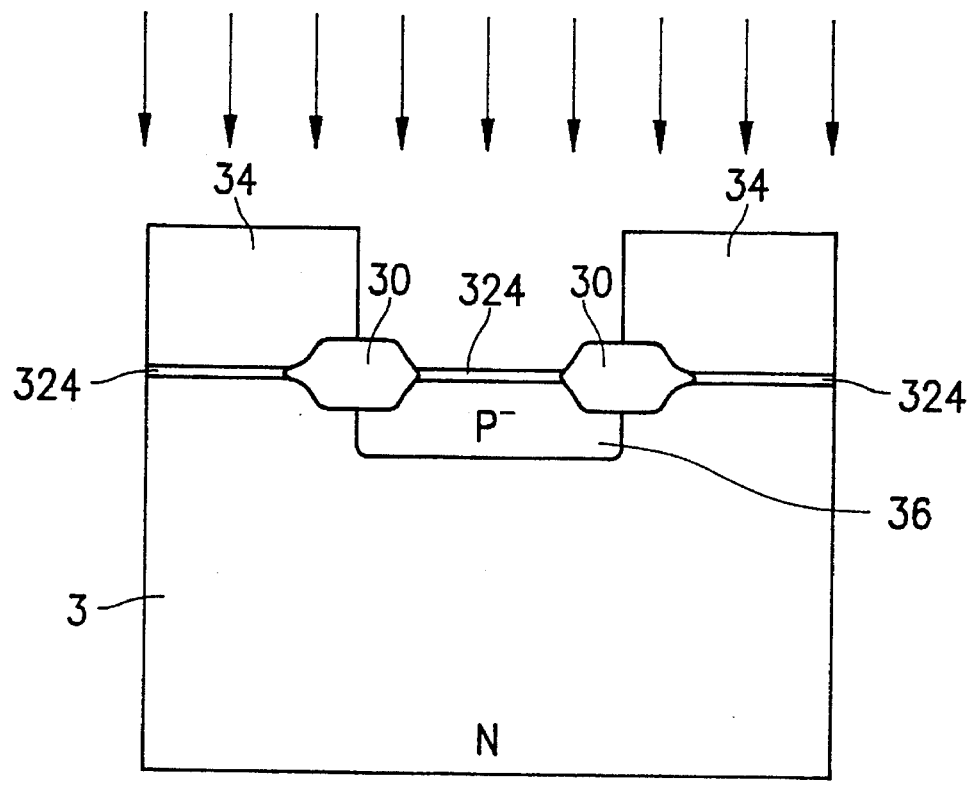
Figure 2D:
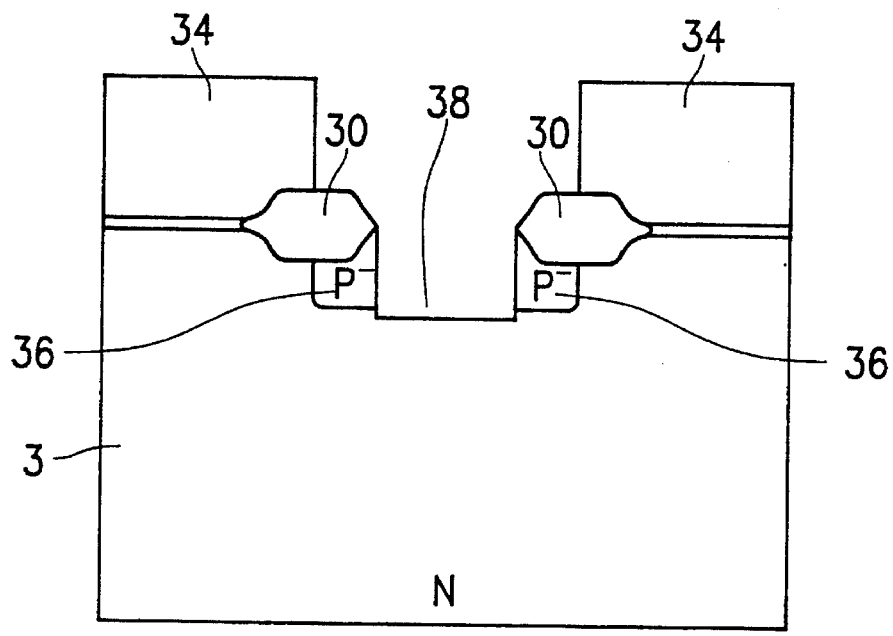

Refer next to FIG. 2c. Field oxide 30 formed in Stage 1 is utilized as the masking layer for the process of implantation of P-type impurities into the region of N-type substrate 3 surrounded by field oxide 30. This can be done by implementing a photoresist layer 34 to mask all areas where the implant of the P-type impurities are not desired, and then perform the implantation procedure by implanting impurities such as, for example, boron or boron fluoride (B or $BF_2$), into the substrate 3. The implanted P-type impurities are further driven into depth of N-type substrate 3 by a procedure of thermal drive in, forming P-type lightly-doped base region 36.

Stage 3

Referring next to FIG. 2d, field oxide 30 is again utilized as the masking layer for an etching process such as, for example, reactive ion etching (RIE) to remove the portion of substrate 3 surrounded by field oxide 30, forming recessed groove 38.

Stage 4

Figure 2E:
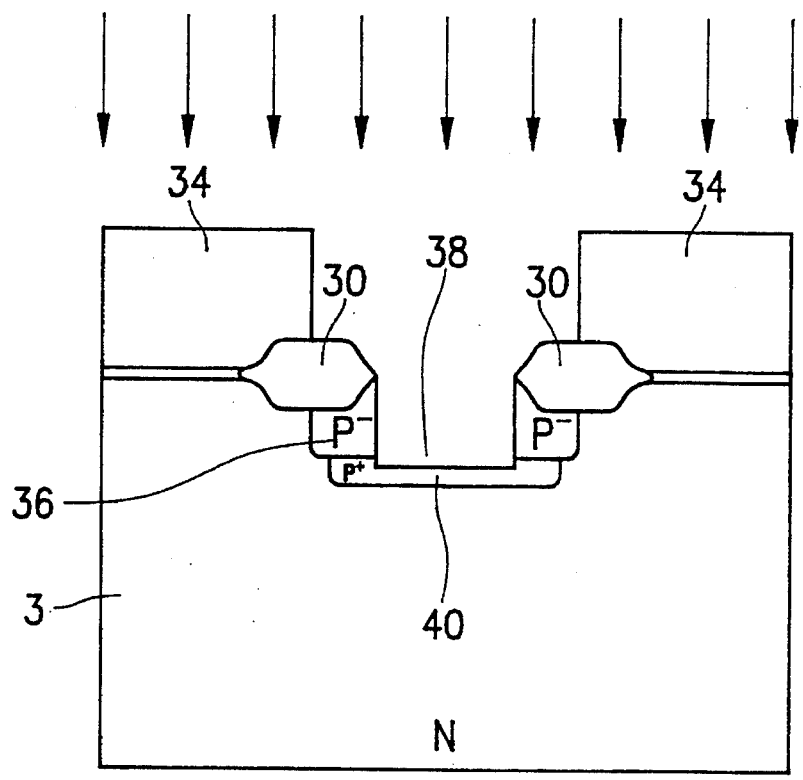

Refer next to FIG. 2e. A process of impurity implantation is performed to implant P-type impurities such as, for example, boron or boron fluoride into the region underneath recessed groove 38. The implanted impurities are further driven in thermally, forming P-type heavily-doped region 40 underneath P-type lightly-doped base region 36, as well as underneath groove 38.

Stage 5

Figure 2F:
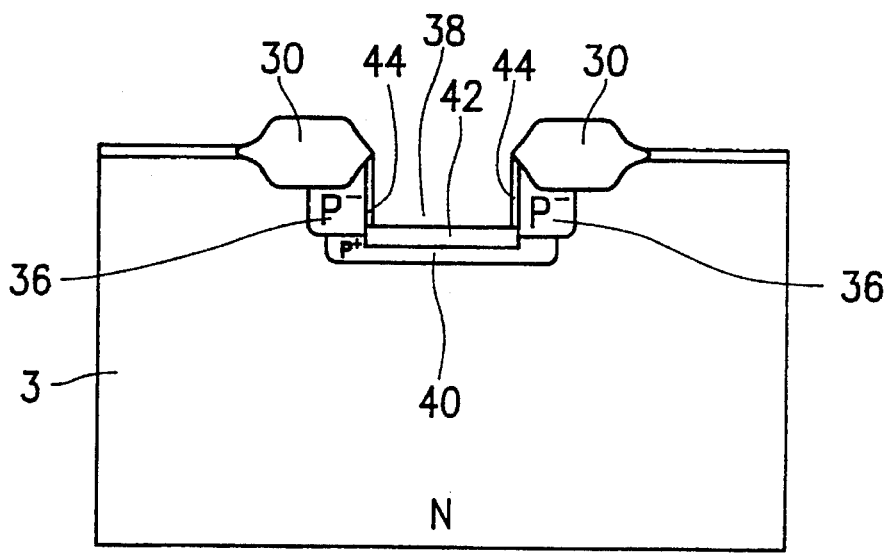
Figure 2G:
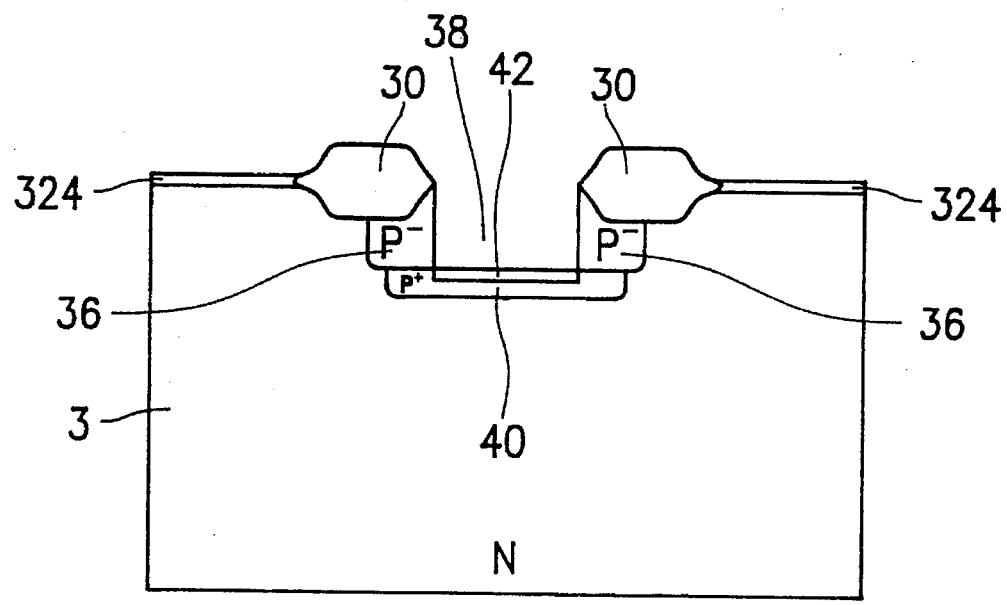

Referring now to FIG. 2f, based on the semiconductor structural configuration of Stage 4 as shown in FIG. 2e, with the photoresist layer 34 removed, a further thermal oxidation procedure is conducted to form a layer of oxide having side portion oxide layer 44 and bottom portion oxide layer 42, as shown in FIG. 2f. Due to the fact that the concentration of impurity implantation is higher in heavily-doped region 40 than in lightly-doped region 36, therefore the thickness of bottom portion oxide layer 42 formed will be larger than in side portion oxide layer 44, with the thickness ratio between the two being about 6 to 1. Further, since the thickness in side portion oxide layer 44 is smaller than in bottom portion oxide layer 42, a controlled etching procedure will be able to completely remove the entire side portion oxide layer 44 while leaving sufficient thickness in bottom portion oxide layer 42, as is seen in FIG. 2g.

Stage 6

Figure 2H:
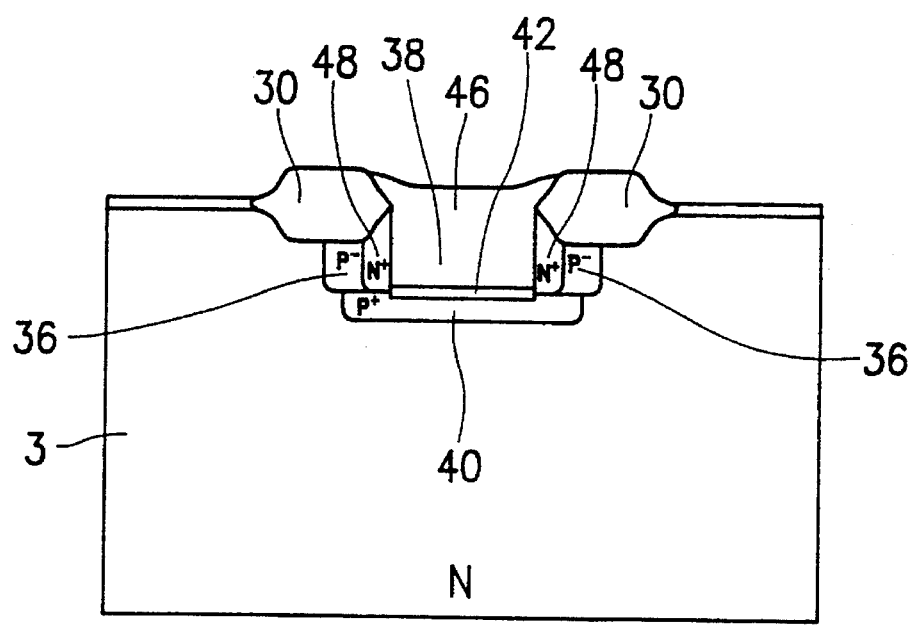

Refer next to FIG. 2h. A process of polysilicon deposition is performed to deposit a layer of electrically conducting material in recessed groove 38, and followed by another procedure of impurity implantation into this material. The implanted impurities further diffuses into lightly-doped regions 36, constituting heavily-doped N-type emitter regions 48. An etching process is then performed to form the electrically conducting and N-type impurity implanted layer 46.

Stage 7

Figure 2I:
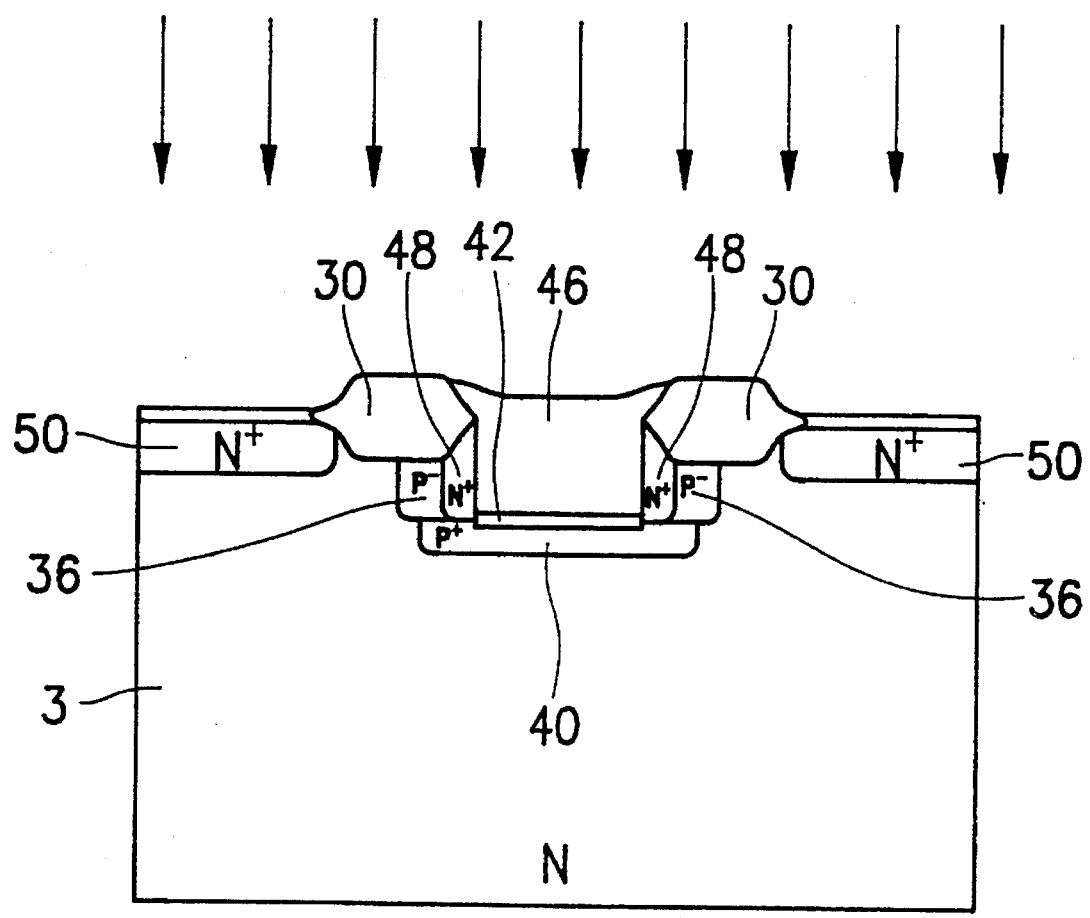

Finally, as shown in FIG. 2i, conducting layer 46 and field oxide 30 are utilized as the masking in an impurity implantation procedure, in which N-type impurities such as, for example, phosphorus are implanted into the substrate 3, forming collector contact area 50.

This above described process for the fabrication of the BJT semiconductor device in accordance with the present invention result in a transistor structural architecture having a P-type heavily-doped implantation region underneath a P-type lightly-doped base region of the bipolar junction transistor structural configuration. Electron carriers in the transistor are thereby prevented from escaping from beneath the base region of the transistor. This assists the collector region's collection of the electron carriers emitted by the emitter of the transistor device. A direct result is the immediate improvement of current gain characteristics of the BJT device.

The above-described preferred embodiment of the present invention is utilized only for the purpose of the description of the present invention. Persons skilled in this art can appreciate the fact that other similar arrangements can be devised from the embodiments disclosed above without departing from the spirit of the present invention, which is recited in the claims that follow.

I claim:

1. A process for fabricating a bipolar junction transistor semiconductor device on a semiconductor substrate of a first conductivity type, comprising the steps of:

forming field oxide at a location on said semiconductor substrate of a first conductivity type for defining base and emitter regions of said bipolar junction transistor, said semiconductor substrate of a first conductivity type forming a collector region of the bipolar junction transistor;

utilizing said field oxide as a masking layer for implanting impurities of a second conductivity type into said substrate in an area surrounded by said field oxide, said impurities being further driven into a depth beneath said field oxide, forming a lightly-doped base region of the second conductivity type;

utilizing said field oxide as a masking layer for etching to form a recessed groove in said substrate surrounded by said field oxide;

implanting and driving in impurities of the second conductivity type into said recessed groove, forming a heavily-doped region of the second conductivity type beneath said recessed groove and said lightly-doped base region of the second conductivity type;

forming an insulating layer on the heavily-doped region of the second conductivity type in said recessed groove;

forming an electrically conducting layer in said recessed groove and implanting impurities of the first conductivity type into said conducting layer, said impurities of the first conductivity type diffusing into said lightly-doped base region of the second conductivity type through side edges of said recessed groove, thereby forming a heavily-doped emitter region of the first conductivity type; and utilizing said electrically conducting layer and said field oxide as masking layers for implanting impurities of the first conductivity type into said substrate of a first conductivity type, thereby forming a contact for said collector region of the bipolar junction transistor.

2. The process for fabricating a bipolar junction transistor semiconductor device of claim 1, wherein the step of forming an insulating layer includes the step of forming an oxide layer on said recessed groove by thermal oxidation and the step of removing said oxide layer formed on the sidewalls of said recessed groove.

3. The process for fabricating a bipolar junction transistor semiconductor device of claim 2, wherein said electrically conducting layer comprises polysilicon.

4. The process for fabricating a bipolar junction transistor semiconductor device of claim 1 wherein said first conductivity type is N type conductivity and said second conductivity type is P type conductivity.

5. The process for fabricating a bipolar junction transistor semiconductor device of claim 1 wherein said first conductivity type is P-type conductivity and said second conductivity type is N type conductivity.

* * * * *